(12) United States Patent
Worley et al.

(10) Patent No.: US 6,555,743 B1
(45) Date of Patent: Apr. 29, 2003

(54) EMI ATTENUATION OBTAINED BY APPLICATION OF WAVEGUIDE BEYOND FREQUENCY CUTOFF TECHNIQUES FOR ADD-IN ITE MASS STORAGE DEVICES

(75) Inventors: Richard N. Worley, Cedar Park, TX (US); Steve L. Williams, Round Rock, TX (US); Leroy Jones, Jr., Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/632,478

(22) Filed: Aug. 4, 2000

(51) Int. Cl.[7] .................................................. H05K 9/00
(52) U.S. Cl. ...................... 174/35 R; 361/800; 361/816
(58) Field of Search ........................ 174/35 R, 35 GC, 174/35 MS; 361/724, 728, 752, 753, 799, 800, 796, 797, 816, 818, 679, 683, 684, 685, 686

(56) References Cited

U.S. PATENT DOCUMENTS

| | | | | |
|---|---|---|---|---|
| 5,262,737 A | * | 11/1993 | Siverling | ...................... 333/12 |
| 5,698,818 A | | 12/1997 | Brench | ...................... 174/35 R |
| 5,859,767 A | * | 1/1999 | Fontana | ...................... 361/818 |
| 6,037,541 A | * | 3/2000 | Bartley et al. | ................. 174/66 |
| 6,163,454 A | * | 12/2000 | Strickler | ...................... 361/695 |
| 6,252,161 B1 | | 6/2001 | Hailey et al. | ............. 174/35 R |

FOREIGN PATENT DOCUMENTS

JP 63281500 * 11/1988 ............... 174/35 R

OTHER PUBLICATIONS

D.J. Angelakos, "Radio Frequency Shielding Properties of Metal Honeycomb Materials and Wire–Mesh Enclosures," IEEE EMC Symposium (1960), pp. 265–280. Copy Enclosed.

* cited by examiner

Primary Examiner—Dean A. Reichard
Assistant Examiner—Carmelo Oliva
(74) Attorney, Agent, or Firm—Baker Botts L.L.P.

(57) ABSTRACT

A computer system including a number of option bays that accommodate optional peripheral equipment, such as CD-ROM drives, DVD drives, magnetic tape backup systems and Zip drives. An unpopulated bay is segmented into compartments by a divider that extends through substantially the entire depth of the bay so that each of the compartments operates as a waveguide beyond frequency cutoff (WBFC). The resulting compartments are characterized by cross-sectional dimensions that are less than the cross-sectional dimensions of the bay, so that the compartmentalization effects substantially enhanced attenuation of electromagnetic signals having a frequency at the highest expected operating frequency of the computer system.

30 Claims, 2 Drawing Sheets

EMI ATTENUATION OBTAINED BY APPLICATION OF WAVEGUIDE BEYOND FREQUENCY CUTOFF TECHNIQUES FOR ADD-IN ITE MASS STORAGE DEVICES

BACKGROUND OF THE INVENTION

1. Field of the Invention

The invention relates to the design and operation of personal computer systems and, more particularly, to techniques for enhancing EMI suppression in an assembly for housing optional ITE mass-storage devices including, but not limited to, CD-ROM drives, DVD drives, magnetic tape backup systems and Zip drives.

2. Description of the Related Art

Contemporary, high-performance personal computer systems typically are required to accommodate numerous kinds of optional ITE (Information Technology Equipment) mass-storage devices, such as CD-ROM drives, DVD drives, magnetic tape backup systems and Zip drives. Generally, these mass-storage devices are installed in a user-accessible mechanical assembly that is disposed within the computer chassis. The mechanical assembly normally includes a number of bays, often three, each of which permits the installation of a mass-storage device of the type alluded to the above. The mass-storage assembly itself may be mechanically and electrically bonded to the front of the personal computer chassis. Frequently, the mechanical design of the optional mass-storage assembly is driven by the daunting requirement to reliably provision the additional mass-storage equipment in the interior of an already densely populated personal computer chassis. Furthermore, the maintenance of adequate air flow through the chassis in order to facilitate dissipation of heat generated by system electronic components and assemblies is a significant collateral design concern. Preoccupation with the aforementioned design constraints has resulted in configurations that fail to adequately address EMI shielding considerations, resulting in ineffective EMI shielding of the mass-storage bay assembly.

Accordingly, what is desired is a mechanism for enhancing the electromagnetic shielding characteristics of the mass-storage bay assembly, without relaxation or disparagement of the prevailing mechanical design criteria. In this regard, and in the manner to be specifically described below, the subject invention adroitly applies waveguide techniques so as to promote the attenuation, both by reflection and absorption, of electromagnetic energy in the mass-storage bay assembly.

Specifically, it is widely understood that a metal aperture with a depth or thickness dimension that is at least equal to the largest cross section dimension of the aperture operates as waveguide beyond frequency cutoff (WBFC). A waveguide so dimensioned attenuates electromagnetic energy both by absorption and reflection. See, for example, D. J. Angelakos, "Radio Frequency Shielding Properties of Metal Honeycomb Materials and Wire-Mesh Enclosures," IEEE EMC Symposium (1960). Common applications of WBFC techniques include honeycomb air vents, control shafts, light pipes, and so forth. U.S. Pat. No. 5,698,818, entitled "Two Part Closely Coupled Cross Polarized EMI Shield" describes a personal computer chassis that embellishes the WBFC technique with cross-polarized air vents to suppress radiation. Similarly, U.S. Pat. No. 6,252,161, entitled "EMI Shielding Ventilation Structure" describes an extruded or a molded conductive air vent constructed from either elastomeric or plastic material. The air vent described therein is based on the WBFC principle and discloses a vent hole pattern that may be inexpensively tailored in both size and shape to simultaneously address both electromagnetic shielding and thermal dissipation requirements. The above-identified patent and patent application are hereby incorporated by reference into this Description.

In general, WBFC configurations are characterized by a waveguide depth that is approximately 3 to 5 times the opening of the aperture. With these dimensional constraints, a shielding effectiveness of between 80 and 100 dB may be realized at operating frequencies below the waveguide cutoff frequency. The subject invention, however, represents an application of the WBFC technique that, although not strictly conforming to the above-stated dimensional constraints, obtains a markedly enhanced level of EMI attenuation that had not heretofore been achievable with respect to mass-storage bay assembly designs.

SUMMARY OF THE INVENTION

The above and other objects, advantages and capabilities are achieved in one aspect of the invention by a drive bay for housing optional mass-storage devices, such as CD-ROM drives, DVD drives, magnetic tape backup systems, Zip drives and the like. The drive bay comprises a plurality of sections, each section for housing an individual mass-storage device or other electronic equipment. The drive bay also comprises a plurality of dividers, each of the dividers for dividing a respective section of the drive bay into a plurality of compartments, wherein a cross-sectional dimension of each of the compartments is sufficiently small to provide substantial attenuation of electromagnetic signals up to the highest expected operating frequency of the computer system. In practice, the dividers cause each of the compartments to be dimensioned so as to effectively operate as a waveguide beyond frequency cutoff (WBFC).

In an alternative embodiment, the invention is realized in a computer system that comprises a plurality of option bays for housing electronic assemblies. The option bays are arranged to be at least pairwise contiguous and are configured to have substantially equal height, width and depth dimensions, whereby the respective height and width dimensions of an option bay define a cross-sectional dimension of the bay. Unpopulated option bays also comprise a divider disposed in at least one of the option bays so as to form a plurality of compartments within the bay. Because the cross-sectional dimension of each of the compartments is less than the cross-sectional dimension of the option bay, the compartments afford substantially enhanced attenuation of electromagnetic signals having a frequency at the highest expected operating frequency of the computer system.

A further embodiment is manifested in an option bay assembly for a computer system. The assembly comprises a plurality of option bays for housing electronic assemblies, the option bays are arranged to be at least pairwise contiguous and are configured to have substantially equal height, width and depth dimensions, whereby the respective height and width dimensions of an option bay define a cross-sectional dimension of the bay. The assembly also comprises a divider disposed in at least one of the option bays to form a plurality of compartments within the bay so that the cross-sectional dimension of each of the compartments is less than the cross-sectional dimension of the option bay. The resulting dimensions of the compartments are such that the compartments afford substantially enhanced attenuation of electromagnetic signals having a frequency at the highest expected operating frequency of the computer system.

In another aspect, the invention is practiced in the form of a method of enhancing the EMI shielding characteristics of an assembly for housing mass-storage devices for a personal computer system, wherein the housing includes at least one storage bay that is physically defined by height, width and depth dimensions. The invention comprises dividing the bay into a number of compartments that extend along the depth of the bay. The largest cross-sectional dimension of the compartments is less than one-third the depth of the bay. As a result, each of the compartments operates as a waveguide beyond frequency cutoff at the highest anticipated operating frequency of the computer system.

BRIEF DESCRIPTION OF THE DRAWINGS

The present invention may be better understood, and its numerous objects, features, and advantages made apparent to those skilled in the art by referencing the accompanying Drawings, where:

FIG. 1, including

The use of the same reference symbols in different drawings indicates similar or identical items.

DETAILED DESCRIPTION

Figure 1A:
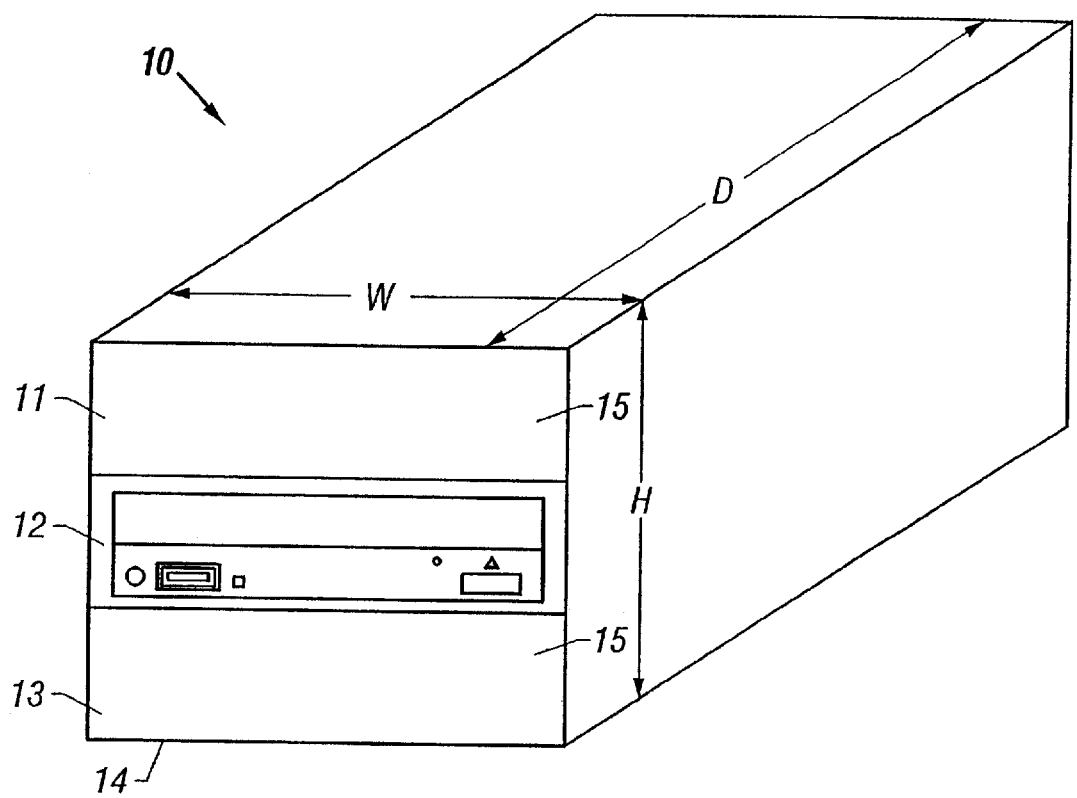
FIGS. 1A and 1B, is a front isometric view of an optional mass-storage bay assembly for a personal computer system. As depicted in FIG. 1, only one of the bays is populated, and the other bays are covered by closeout panels.
Figure 1B:
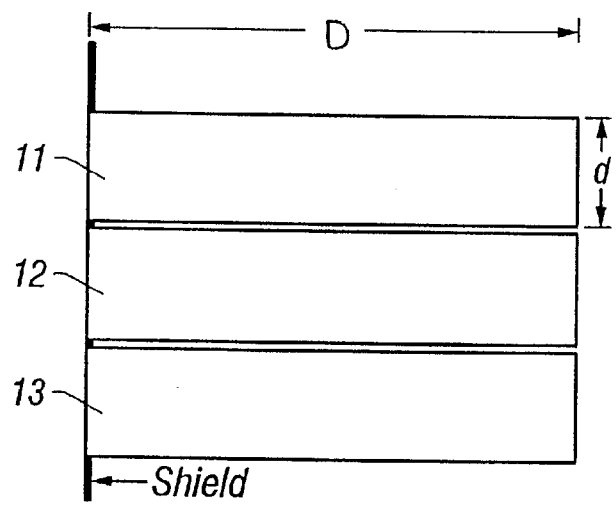

For a thorough understanding of the subject invention, reference is made to the following Detailed Description, including the appended Claims, in connection with the above-described Drawings. Referring now to FIG. 1, a typical mass-storage bay assembly 10 for housing optional electronic mass-storage equipment, such as CD-ROM drives, DVD drives, magnetic tape backup systems, Zip drives and the like, is seen there to include a number of mass-storage bays 11, 12 and 13. Only one of the bays, bay 12, is depicted FIG. 1 as populated. Mass-storage bay assembly 10 includes a metallic housing 14 that assumes the dimensions 5.6" (width)×5.25" (height)×5.25" (depth). Each of the three bays depicted in FIG. 1 will have the dimensions 5.6" (W)×1.75" (H)×5.25" (D). Each of the bays also includes the necessary mechanical hardware (not shown) for mounting and holding mass-storage devices of the kind referred to above. The mounting hardware is not considered an aspect of the invention, but typically includes rails, trays, slides, clips, screws and the like. In addition, unpopulated storage bays are covered by shield closeout panels 15.

The walls of housing 14 are solid metal and are preferably bonded to the front panel of the computer system chassis. Ideally, bonding of the walls of housing 14 to the chassis front panel is imparted at a resistance of less than 2.5 milliohm. Additionally, the bond interval of housing 14 to the front panel is established at less than 1/20 the wavelength, λ, of the highest expected operating frequency of the computer system. For purposes of this Description, it is assumed that the computer's CPU operates at a clock frequency of 4 GHz and that the highest spectral component with significant energy content is limited to 8 GHz. As is well known, the wavelength of signal at a given frequency, f (in MHz), is given by:

$$\lambda = \frac{300 \text{ meter}}{f \text{ (in MHz)}}.$$

Therefore, the wavelength of an 8 GHz signal is 0.0375 m, requiring a bonding interval of 0.1875 cm, or, equivalently, 0.074 inch. Because the shielding effectiveness, SE (in dB), at a frequency corresponding to a wavelength, λ, is given by the relationship:

$$SE = 20 \text{ Log } (\lambda/l),$$

where "l" is the bonding interval, a bonding interval of 0.1875 cm will provide 20 dB attenuation of an 8 GHz signal. As a matter of design choice, increased shielding effectiveness may be realized by reducing the bonding interval.

Without more, the mass-storage bay assembly depicted in FIG. 1, having three bays, or sections, with the dimensions 5.6" W×1.75" H×7.9" D can be expected, as a WBFC, to provide a degree of shielding effectiveness in accordance with the following analysis, where the analysis considers each of the bays 11, 12, and 13 as a WBFC. The cutoff frequency $f_c$ is equal to $$\frac{5.9 \times 10^9}{AD} \text{MHz, where } AD$$

is the largest cross-sectional aperture dimension for the waveguide in inches. In the case of the waveguide formed by the three unpopulated bays, the largest cross-sectional aperture dimensions is the diagonal across the face of the waveguide. This diagonal can be calculated to have the dimension 5.87." The corresponding cutoff frequency is then 1005.6 MHz.

The shielding effectiveness for a waveguide beyond cutoff, having n apertures, is given by:

$$SE = \{(27.2)(t/AD)\} - \{20 \text{Log} \sqrt{n}\} dB,$$

where "t" is the depth of the waveguide.

Therefore, because the effective waveguide formed by the housing 14 and bays 11, 12, and 13 is characterized by a length of 7.9" and AD=5.86," and three apertures (each bay effectively forming an aperture), the resulting shielding effectiveness may be calculated to be 31.9 db.

Figure 2:
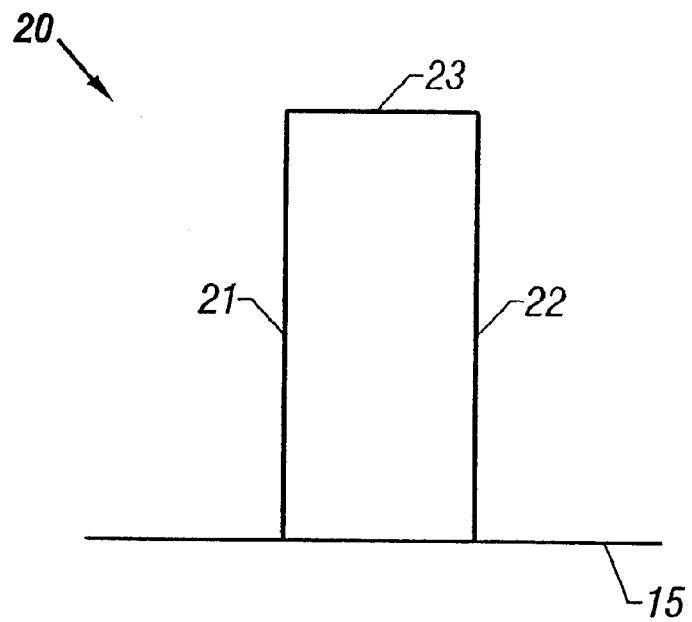
FIG. 2 is a top plan of view of one version of the divider, with the divider may be attached to a closeout panel.
Figure 3:
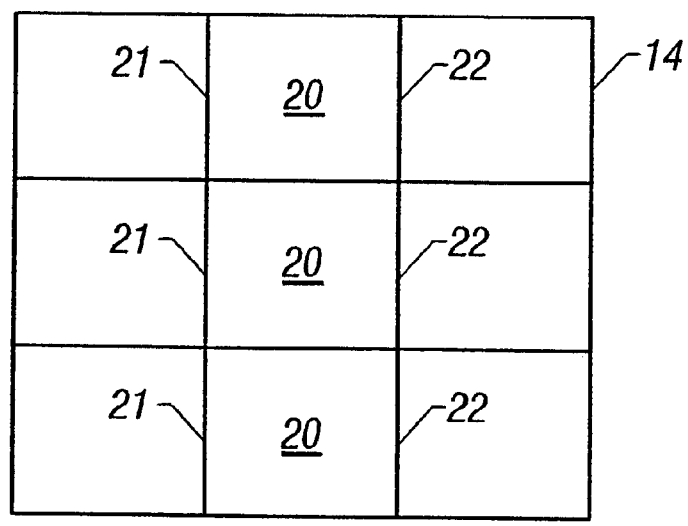
FIG. 3 is a representation of the manner in which insertion of dividers in unpopulated bays forms compartments, each corresponding to a WBFC.

However, in accordance with the subject invention, the shielding effectiveness of an unpopulated bay assembly can be dramatically enhanced. An enhancement in shielding effectiveness can be obtained by inserting a divider 20 in each of the unpopulated bays 11,12, and 13. As illustrated in FIG. 2, the divider is an integral metallic insert consisting of substantially parallel walls 21 and 22 and a rear panel member 23 that extends orthogonally between the walls and joins the walls at three respective ends. Walls 21 and 22 have a length substantially equal to the depth of bays 11, 12, and 13 and have a height constructed to be substantially equal to the height of each of the bays, 1.75." In a preferred embodiment of the invention, the length of rear panel member 23 is chosen to be 1/3 the width of the bay, or 1.87." When a divider 20 is inserted in each (unpopulated) bay, housing 14 presents a frontal cross-section as represented by FIG. 3. In a preferred embodiment of the invention, each of the dividers 20 may be attached to a corresponding closeout panel 15 prior to insertion into a bay.

Given the application of WBFC theory explicated above, one with ordinary skill in the art will perceive that the waveguide effectively formed by inserting dividers 20 in each of three unpopulated bays corresponds to a waveguide having nine (9) apertures, each with a largest cross-sectional dimension, AD, equal to 2.56." From the above Equation 2, the shielding effectiveness for such a structure will be 74.4 db. This represents an improvement in shielding effectiveness of approximately three orders of magnitude with respect to unpopulated bays, sans divider. Theoretically, even greater shielding effectiveness can be obtained by dividing each bay into more than three compartments. To divide each bay into N compartments requires a divider with (N−1) walls and (N−2) rear panel members. Each rear panel member will then have a length equal to (W/N), where "W" is the width of a bay.

Although the invention has been described with respect to the specific exemplary embodiments set forth above, the invention is not limited to those embodiments set forth above, the invention is not limited to those embodiments. Various modifications, improvements and additions may be implemented by those skilled in the art, and such modifications, improvements an additions will not depart from the scope of the invention, as defined by the appended Claims. For example, the invention has been described in the context of a desire to suppress EMI in a personal computer system, and is focused particularly on a bay assembly for housing mass-storage devices. A fundamental inventive concept derives from the recognition that vacant bays may be effectively transformed into a waveguide, operating in WBFC mode at relevant frequencies, by the simple insertion of a properly dimensional conductive insert into the bay. Clearly, this solution is applicable to electronic equipments other than personal computer systems. Furthermore, although the dividers described above divide the bays into compartments having rectangular cross-sections, the dividers may be otherwise configured so as to effect other and different waveguide geometries. However, it is recognized that such specific approaches represent but an insubstantial deviation from the embodiments of the invention described above. The Claims below are properly construed to embrace all modifications, variations and improvements that fall within the true spirit and scope of the, as well as substantial equivalents thereof. Accordingly, other embodiments of the invention, though not described with particularly herein, are nonetheless comprehended with the scope of the invention, as defined by the Claims below.

What is claimed is:

1. A drive bay for a computer system, the drive bay comprising:
   a plurality of mass-storage bays, each mass-storage bay for storing an electronic assembly; and
   a plurality of dividers, each of the dividers for dividing an unpopulated respective mass-storage bay into a plurality of compartments, wherein a cross-sectional dimension of each of the compartments is sufficiently small to provide substantial attenuation of electromagnetic signals at the highest expected operating frequency of the computer system.

2. A drive bay as defined in claim 1, wherein each of the mass-storage bays is characterized by respective height, width and depth dimensions and wherein each of the dividers comprises (N−1) vertical walls for dividing the unpopulated mass-storage bay into N compartments, the walls having a height substantially equal to the height of a section and a length substantially equal to the depth of the mass-storage bay.

3. A drive bay as defined in claim 2, wherein the divider walls are joined at respective ends by a rear panel member extending orthogonally between the walls and having a length substantially equal to (1/N) times the width of the unpopulated mass-storage bay.

4. A drive bay as defined in claim 1, wherein the divider is fabricated from a conductive material so that each of the compartments formed by the divider operates, with respect to the highest expected operating frequency of the computer system, as a waveguide beyond cutoff frequency.

5. A computer system comprising:
   a plurality of mass-storage bays for housing electronic assemblies, the mass-storage bays arranged to be at least pairwise contiguous and are configured to have substantially equal heights, width and depth dimensions, whereby the respective height and width dimensions of a mass-storage bay define a cross-sectional dimension of the bay; and
   a divider disposed in at least one of the mass-storage bays, wherein the at least one mass-storage bay is unpopulated, so as to form a plurality of compartments within the unpopulated bay so that the cross-sectional dimension of each of the compartments is less than the cross-sectional dimension of the unpopulated mass-storage bay, whereby the compartments afford substantially enhanced attenuation of electromagnetic signals having a frequency at the highest expected operating frequency of the computer system.

6. A computer system as defined in claim 5, further comprising at least one closeout panel covering the cross-section of the unpopulated mass-storage bay for shielding the unpopulated mass-storage bay.

7. A computer system as defined in claim 6, wherein the divider is attached to the closeout panel.

8. A computer system as defined in claim 5, wherein the mass-storage bays are vertically stacked and wherein the divider comprises (N−1) vertical walls for dividing the unpopulated mass-storage bay into N compartments, the walls having a height substantially equal to the height of the unpopulated mass-storage bay and a length substantially equal to the depth of the unpopulated mass-storage bay.

9. A computer system as defined in claim 8, further comprising at least one closeout panel covering the cross-section of the unpopulated mass-storage bay for shielding the unpopulated mass-storage bay.

10. A computer system as defined in claim 9, wherein the divider is attached to the closeout panel.

11. A computer system as defined in claim 8, wherein the walls of the divider are separated by a distance equal to approximately (1/N) times the width of the unpopulated mass-storage bay so the cross-sectional dimension of each of the compartments is defined by the height of the mass-storage bay and (1/N) times the width of the unpopulated mass-storage bay.

12. A computer system as defined in claim 11, further comprising at least one closeout panel covering the cross-section of the unpopulated mass-storage bay for shielding the unpopulated mass-storage bay.

13. A computer system as defined in claim 12, wherein the divider is attached to the closeout panel.

14. A computer system as defined in claim 11, wherein the divider further comprises an integral divider having a first wall and a second wall, wherein the walls are connected at respective ends by a rear panel member having a height substantially equal to the height of the walls and a length substantially equal to (1/N) times the width of the unpopulated mass-storage bay.

15. A computer system as defined in claim 5, wherein the divider is fabricated from a conductive material.

16. An option bay assembly for a computer system, the option bay assembly comprising:

a plurality of mass-storage bays, each mass-storage bay for storing an electronic assembly, the mass-storage bays arranged to be pairwise contiguous and configured to have substantially equal height, width and depth dimensions, whereby the respective height and width dimensions of a mass-storage bay define a cross-sectional dimension of the mass-storage bay; and a divider disposed in at least one of the mass-storage bays, wherein the at least one mass-storage bay is unpopulated, so as to form a plurality of compartments within the bay so that the cross-sectional dimension of each of the compartments is less than the cross-sectional dimension of the unpopulated mass-storage bay, whereby the compartments afford substantially enhanced attenuation of electromagnetic signals having a frequency at the highest expected operating frequency of the computer system.

17. An mass-storage bay assembly as defined in claim 16, wherein the mass-storage bays are vertically stacked and wherein the divider comprises N−1 vertical walls for dividing the unpopulated mass-storage bay into N compartments, the walls having a height substantially equal to the height of the unpopulated mass-storage bay and a length substantially equal to the depth of the unpopulated mass-storage bay.

18. An mass-storage bay assembly as defined in claim 17, wherein the walls of the divider are separated by a distance equal to the approximate (1/N) times the width of the unpopulated mass-storage bay so the cross-sectional dimension of each of the compartments is defined by the height of the unpopulated mass-storage bay and (1/N) times the width of the unpopulated mass-storage bay.

19. A mass-storage bay assembly as defined in claim 18, wherein the divider further comprises an integral divider having a first wall and a second wall, wherein the walls are connected at respective ends by a rear panel member.

20. A mass-storage bay assembly as defined in claim 19, wherein the rear panel member has a height substantially equal to the height of the walls and a length substantially equal to (1/N) times the width of the unpopulated mass-storage bay.

21. A mass-storage bay assembly as defined in claim 19, wherein the rear panel member has a height substantially equal to the height of the walls and a length substantially equal to (1/N) times the width of the mass-storage bay.

22. A mass-storage bay assembly as defined in claim 21, wherein the divider is fabricated from a conductive material.

23. A mass-storage bay assembly as defined in claim 16, wherein the divider is fabricated from a conductive material.

24. A mass-storage bay assembly as defined in claim 16, further comprising a closeout panel covering the cross-section of the unpopulated mass-storage bay and attached to the divider.

25. A method of enhancing the EMI shielding characteristics of an assembly for housing mass-storage devices for a personal computer system, wherein the assembly comprises at least one unpopulated mass-storage bay having a depth dimension, the method comprising the step of dividing the unpopulated mass-storage bay into a plurality of compartments so that the depth dimension is at least three times greater than the largest cross-sectional dimension of an aperture formed by a compartment.

26. A method as defined in claim 25, wherein the unpopulated mass-storage bay is divided by inserting a divider.

27. A method as defined in claim 26, wherein the divider has a length substantially equal to the depth of the unpopulated mass-storage bay.

28. A method as defined in claim 27, wherein the divider comprises a pair of walls connected by a rear panel member.

29. A method as defined in claim 28, wherein the width of the rear panel member is no greater than (⅓) times the width of the unpopulated mass-storage bay.

30. A method as defined in claim 29, wherein the divider is integrally formed from a conductive material.

\* \* \* \* \*